(12) United States Patent
Tsai et al.

(10) Patent No.: US 8,489,903 B2
(45) Date of Patent: Jul. 16, 2013

(54) SYSTEM FOR MAINTAINING POWER EFFICIENCY OF POWER SUPPLY MODULES BY SELECTIVELY CONNECTING AND DISCONNECTING POWER SUPPLY MODULES FROM A PLURALITY OF POWER SUPPLY MODULES BASED ON THE CALCULATED POWER SUPPLY MODULE OUTPUT TO INPUT RATIO OF EACH MODULE

(75) Inventors: Yu-Chi Tsai, Taipei Hsien (TW); Kuei-Chih Hou, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 320 days.

(21) Appl. No.: 12/882,158

(22) Filed: Sep. 14, 2010

(65) Prior Publication Data

US 2012/0005492 A1 Jan. 5, 2012

(30) Foreign Application Priority Data

Jun. 30, 2010 (TW) .................................. 099121548

(51) Int. Cl.
*G06F 1/00* (2006.01)
*G06F 1/26* (2006.01)

(52) U.S. Cl.
USPC .......................................... 713/300; 713/320

(58) Field of Classification Search
USPC ...................................... 713/300, 320; 307/43
See application file for complete search history.

(56) References Cited

U.S. PATENT DOCUMENTS

| 2004/0061380 A1* | 4/2004 | Hann et al. ....................... 307/43 |
| 2004/0181730 A1* | 9/2004 | Monfared et al. ............. 714/745 |
| 2005/0028017 A1* | 2/2005 | Janakiraman et al. ........ 713/340 |
| 2008/0028246 A1* | 1/2008 | Witham ......................... 713/330 |
| 2009/0254768 A1* | 10/2009 | Livescu et al. ................ 713/320 |
| 2010/0174927 A1* | 7/2010 | Kim et al. ..................... 713/300 |

\* cited by examiner

*Primary Examiner* — Thomas Lee
*Assistant Examiner* — Terrell Johnson
(74) *Attorney, Agent, or Firm* — Altis Law Group, Inc.

(57) ABSTRACT

A power supply system for supplying power to a number of loads includes a number of power supply modules, a bus, and a control module. The power supply modules each comprises an input terminal receiving an input power and an output terminal outputting an output power, the input terminals of power supply modules having the same input power. The bus is configured for connecting the loads to the power supply modules. The control module calculates the ratio of the total output power of the power supply modules to the input power of one power supply module and controls the connection and the disconnection of the power supply modules according to the ratio.

2 Claims, 4 Drawing Sheets

SYSTEM FOR MAINTAINING POWER EFFICIENCY OF POWER SUPPLY MODULES BY SELECTIVELY CONNECTING AND DISCONNECTING POWER SUPPLY MODULES FROM A PLURALITY OF POWER SUPPLY MODULES BASED ON THE CALCULATED POWER SUPPLY MODULE OUTPUT TO INPUT RATIO OF EACH MODULE

BACKGROUND

1. Technical Field

The present disclosure relates to power supply systems and, particularly relates to a power supply system used in a server.

2. Description of Related Art

Current servers include a power supply system supplying electrical power to a number of loads (i.e., blade servers). In order to ensure the loads are always working under normal conditions, the input power of the power supply system should be greater than the total working power of the loads, which is equal to the output power of the power supply system. As the output power is lower than the input power of the power supply system, a part of the input power is wasted.

Therefore, it is desirable to provide a power supply system which can overcome the limitations described above.

DETAILED DESCRIPTION

Embodiments of the disclosure will now be described in detail, with reference to the accompanying drawings.

Figure 1:
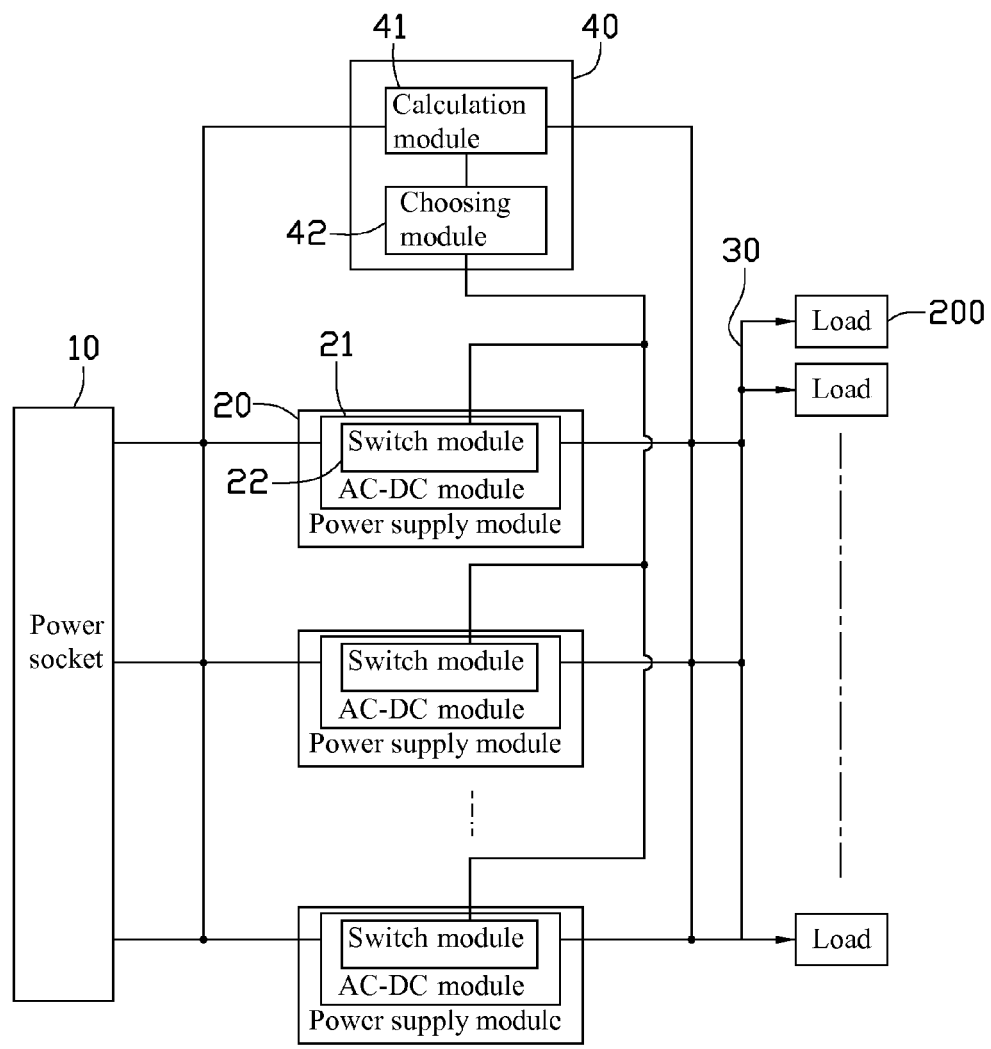
FIG. 1 is a functional block diagram of a power supply system, according to a first exemplary embodiment.

Referring to FIG. 1, a power supply system 100 for a server in accordance with a first exemplary embodiment is shown. The power supply system 100 supplies electrical power to a number of loads 200, and includes a power socket 10, a number of power supply modules 20, a bus 30, and a control module 40. The power supply modules 20 interconnect the power socket 10 and the bus 30. The control module 40 connects with the power supply modules 20 and controls the connection and the disconnection of the power supply modules 20. The loads 200 are connected to the bus 30. In this embodiment, the loads 200 are blade servers.

The power socket 10 includes an input terminal connected to an electric network and a number of output terminals. An initial power output from the electric network is averaged to a number of sub-powers by the power socket 10. The sub-powers are output from the output terminals correspondingly. In this embodiment, the power socket 10 includes six output terminals. Therefore, if the initial power is 220V*120 A, the sub-powers are 220V*20 A.

Each of the power supply modules 20 includes an input terminal, an output terminal, and an AC-DC module 21 interconnected the input terminal and the output terminal The AC-DC module 21 is configured for converting an alternating current to a directing current. The input powers of the input terminals have the same input power. The input power of the input terminal is different than the output power of the output terminal The input power of the power supply module 20 is equal to the sub-power output from the power socket 10. Generally, the input power is greater or equal to the output power. The AC-DC module 21 includes a switch module 22 control the connection and disconnection of the power supply module 20. The switch module 22 is an electronic switch, such as a transistor. In this embodiment, the number of the power supply modules 20 is equal to the number of the output terminals of the power socket 10.

The bus 30 is for receiving the output power output from the power supply modules 20. The bus 30 supplies the power to the loads 200.

The control module 40 includes a calculation module 41 and a choosing module 42 electrically connected to the calculation module 41. The calculation module 41 is connected to the input and output terminals of each of the power supply modules 20. The choosing module 42 is connected to the switch modules 22 of each of the power supply modules 20 by an $I^2C$ bus. It should be noteworthy that the choosing module 42 can respectively connect to the switch modules 22 with an independent wire. The calculation module 41 receives the input power and the output power from the input and output terminals of the power supply modules 20. The choosing module 42 controls the switch modules 22 according to the ratio of the total output power of the output terminals and the input power of one input terminal.

In operation, if the input power of the input terminal of the power socket 10 is 120 W, the output power of the output terminal is about 20 W. The input power of the input terminal of the power supply module 20 equals to the output power of the output terminal of the power socket 10. The output power of the output terminal of the power supply module 20 is equal to the working power of the loads 200.

Initially, the choosing module 42 turns on the switch modules 22 of each power supply module 20. The six power supply modules 20 supply power to the loads 200 with the bus 30. Then, the calculation module 41 receives the input power and the output power of the power supply modules 20. If the working power of the loads 200 is about 55 W, that is to say, the output power of the supply modules 20 is about 55 W. The choosing module 42 turns on three power supply modules 20 and turns the others off. If the working power of the loads 200 increases to about 65 W, the three power supply modules 20 cannot supply enough power to the loads 200. The choosing module 42 turns on the other power supply modules 20 to supply enough power to the loads 200.

The number of the power supply modules 20 may vary in other embodiments as needed. To increase the number of the power supply modules 20 to supply power to the loads 200, the power supply system 100 different from the present exemplary embodiment can supply power more efficiently.

Figure 2:
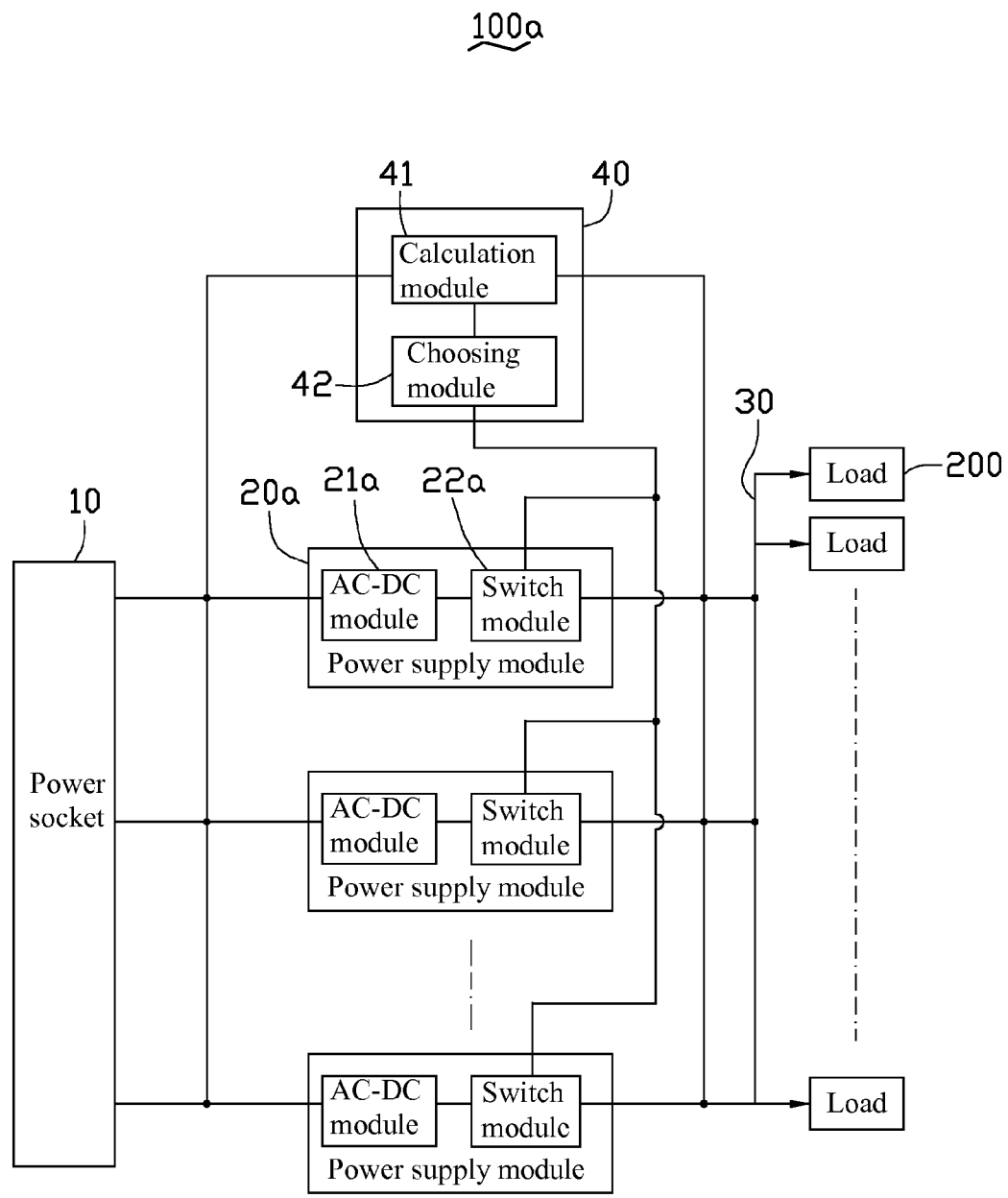
FIG. 2 is a functional block diagram of a power supply system, according to a second exemplary embodiment.

Referring to FIG. 2, a power supply system 100a according to a second embodiment is shown. The difference between the power supply system 100a and the power supply system 100 of the first exemplary embodiment is that the power supply modules 20a includes an AC-DC module 21a and a switch module 22a electrically connected with the AC-DC module 21a. The AC-DC module 21a and the switch module 22a are connected in series between the input terminal and output terminal of the power supply module 20.

Figure 3:
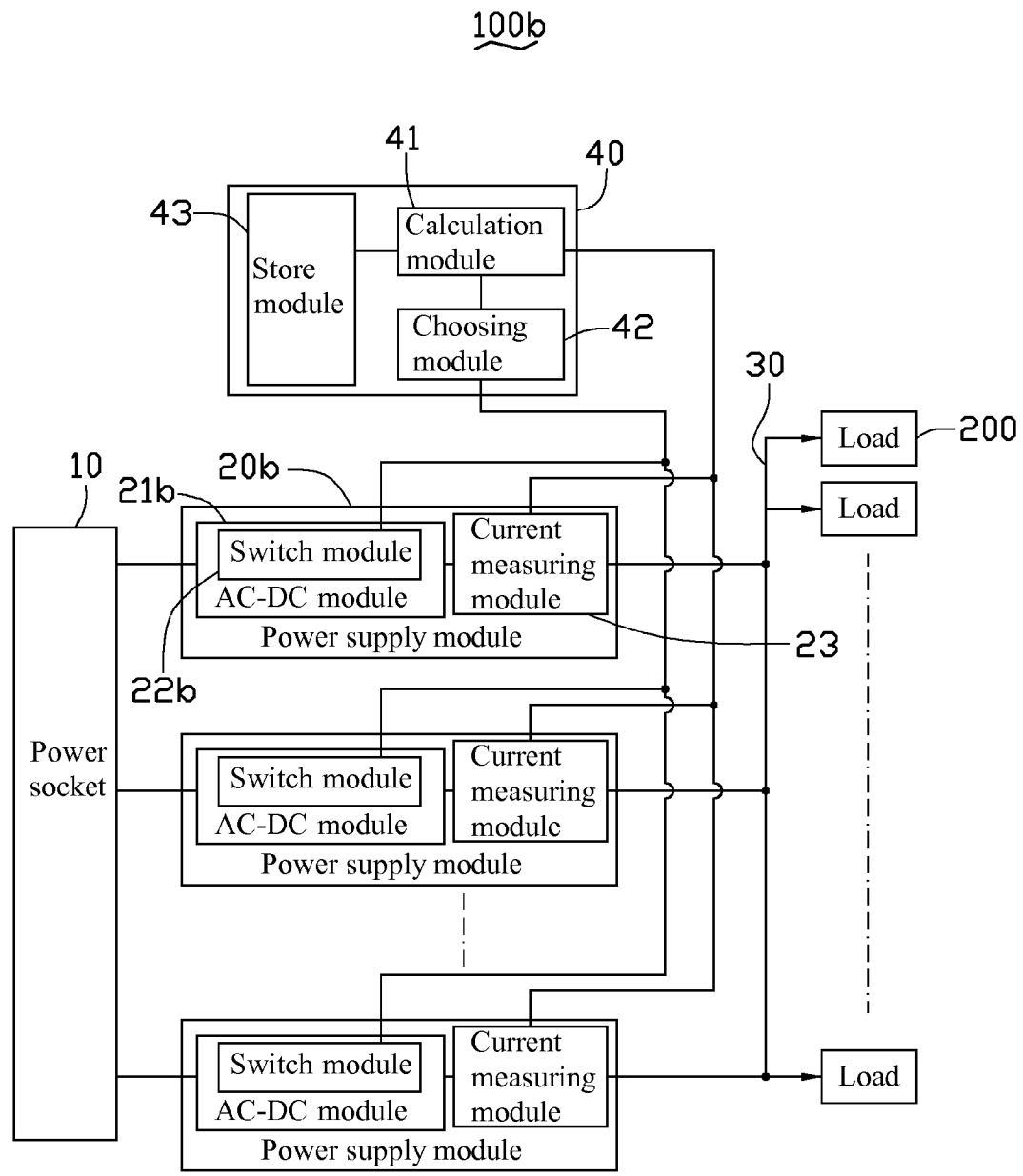
FIG. 3 is a functional block diagram of a power supply system, according to a third exemplary embodiment.

Referring to FIG. 3, a power supply system 100b according to a third embodiment is shown. The difference between the power supply system 100b and the power supply system 100 of the first exemplary embodiment is that the power supply module 20b further includes a current measuring module 23 connected with the AC-DC module 21*b*. The control module 40 further includes a store module 43 connected with the calculation module 41. The calculation module 41 connects with the current measuring modules 23 of the power supply module 20*b*. The choosing module 42 connects with the switch modules 22*b* of the AC-DC module 21*b*. The store module 43 pre-stores the input power of the power supply module 20*b* therein. The calculation module 41 receives currents value from the current measuring modules 23 and calculates the total output power of the power supply modules 20*b*. The calculation module 41 compares the total output power of the power supply modules 20*b* with the input power stored in the store module 43. The choosing module 42 controls the switch modules 22*b* according to the ratio of the total output power of the power supply modules 20*b* and the input power of each power supply module 20*b*.

Figure 4:
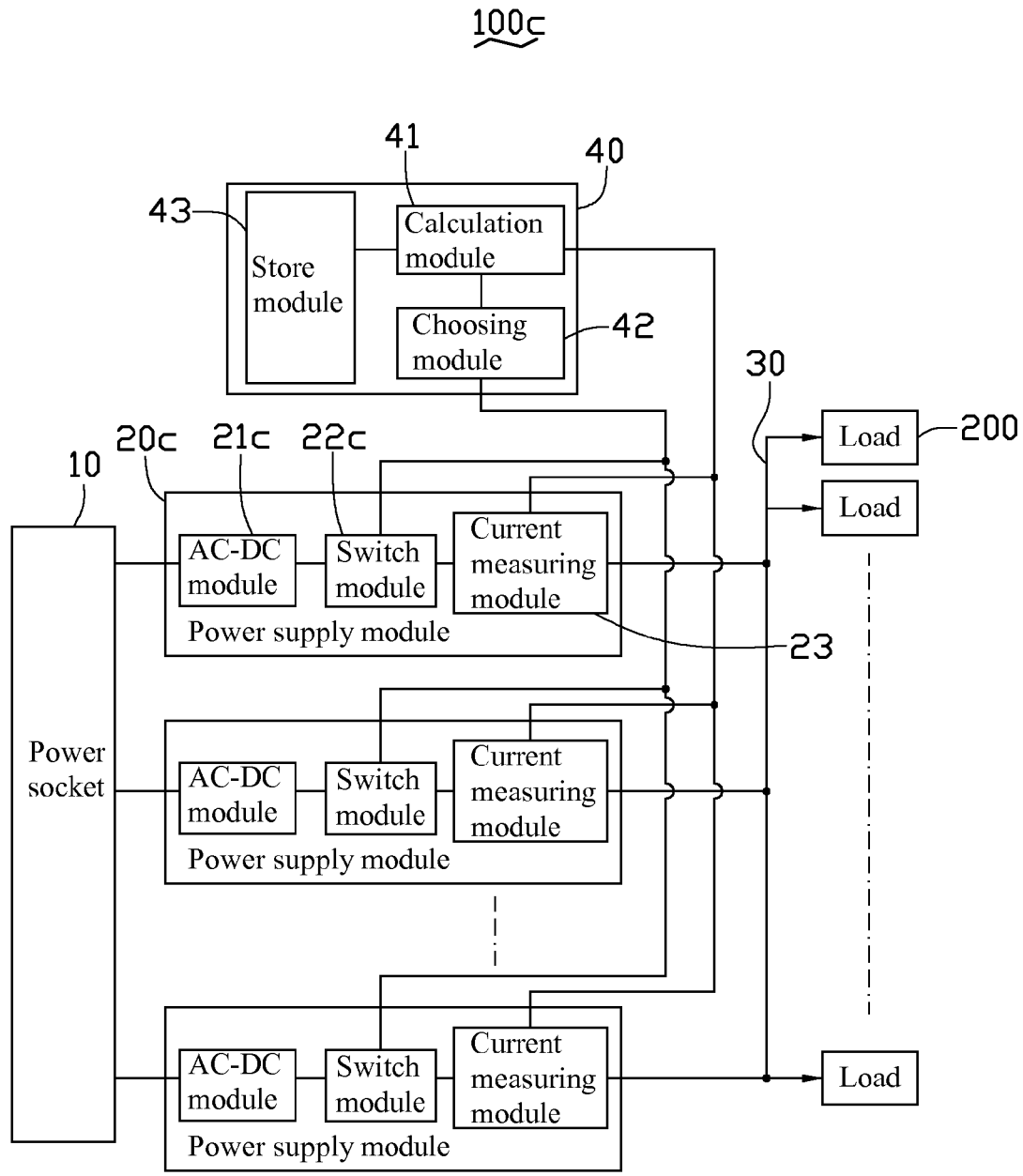
FIG. 4 is a functional block diagram of a power supply system, according to a fourth exemplary embodiment.

Referring to FIG. 4, a power supply system 100*c* according to a fourth embodiment is shown. The difference between the power supply system 100*c* and the power supply system 100*b* of the third exemplary embodiment is that the power supply modules 20*c* includes an AC-DC module 21*c* and a switch module 22*c* electrically connected with the AC-DC module 21*c*. The AC-DC module 21*c*, the switch module 22*c*, and the current measuring modules 23 are connected in series between the input terminal and output terminal of the power supply module 20.

It will be understood that particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A power supply system for supplying power to a plurality of loads, comprising:
    a plurality of power supply modules each comprising an input terminal receiving an input power and an output terminal outputting an output power, the input terminals of the power supply modules having the same input power; wherein each of the power supply modules comprises an AC-DC module interconnected the input terminal and the output terminal thereof; the AC-DC module comprises a switch module;
    a bus configured for connecting the power supply modules to the loads; and
    a control module comprising a calculation module and a choosing module electrically connected to the calculation module; the calculation module connected to the input and output terminals of each of the power supply modules; the choosing module connected to the switch module of each of the power supply modules, the control module configured for calculating the ratio of the total output power of the power supply modules to the input power of one power supply module, and controlling the connection and the disconnection of the power supply modules according to the ratio.

2. A power supply system for supplying power to a plurality of loads, comprising:
    a plurality of power supply modules each comprising an input terminal receiving an input power and an output terminal outputting an output power, the input terminals of the power supply modules having the same input power; each of the power supply modules comprising an AC-DC module and a switch module; the AC-DC module and the switch module connected in series between the input terminal and the output terminal;
    a bus configured for connecting the power supply modules to the loads; and
    a control module, wherein the control module comprises a calculation module and a choosing module electrically connected to the calculation module; the calculation module is connected to the input and output terminals of each of the power supply modules; the choosing module is connected to the switch module of each of the power supply modules; the control module is configured for calculating the ratio of the total output power of the power supply modules to the input power of one power supply module, and controlling the connection and the disconnection of the power supply modules according to the ratio.

\* \* \* \* \*